United States Patent
Pathak et al.

(10) Patent No.: US 10,650,874 B2
(45) Date of Patent: May 12, 2020

(54) MAGNETIC MEMORY DEVICE WITH ENHANCED WRITE PERFORMANCE AND OPERATION METHOD THEREOF

(71) Applicants: SK hynix Inc., Icheon (KR); Industry-Academic Cooperation Foundation, Yonsei University, Seoul (KR)

(72) Inventors: Sachin Pathak, Seoul (KR); Kangwook Jo, Goyang (KR); Jongil Hong, Seoul (KR); Hongil Yoon, Seoul (KR)

(73) Assignees: SK hynix Inc., Icheon (KR); Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 15/724,905

(22) Filed: Oct. 4, 2017

(65) Prior Publication Data
US 2018/0268889 A1    Sep. 20, 2018

(30) Foreign Application Priority Data
Mar. 14, 2017    (KR) .......................... 10-2017-0031561

(51) Int. Cl.
G11C 11/16    (2006.01)
G11C 11/18    (2006.01)

(52) U.S. Cl.
CPC .......... *G11C 11/1675* (2013.01); *G11C 11/18* (2013.01); *G11C 11/161* (2013.01)

(58) Field of Classification Search
CPC .... G11C 11/1675; G11C 11/161; G11C 11/15
USPC .......................................................... 365/158
See application file for complete search history.

(56) References Cited

U.S. PATENT DOCUMENTS

| | | | | |
|---|---|---|---|---|
| 2008/0266696 | A1* | 10/2008 | Dina | G11B 5/012 360/55 |
| 2011/0063899 | A1* | 3/2011 | Ogimoto | H01L 27/224 365/158 |
| 2014/0056060 | A1* | 2/2014 | Khvalkovskiy | H01L 27/228 365/158 |

FOREIGN PATENT DOCUMENTS

| | | |
|---|---|---|
| KR | 10-1433735 B1 | 8/2014 |
| KR | 10-1497863 B1 | 3/2015 |

OTHER PUBLICATIONS

Johan Åkerman, "Toward a Universal Memory", Science, Apr. 22, 2005, pp. 508-510, vol. 308, AAAS.

S. Yuasa et al., "Giant tunnel magnetoresistance in magnetic tunnel junctions with a crystalline MgO(001) barrier", Journal of Physics D: Applied Physics, Oct. 19, 2007, pp. R337-R354, vol. 40, IOP Publishing.

(Continued)

*Primary Examiner* — Anthan Tran

(57) ABSTRACT

A magnetic memory device includes a magnetic element and a write circuit electrically connected to two nodes of the magnetic element and configured to provide a write current to the magnetic element, wherein the write current includes a first current having a first peak applied for a first time period and a second current having a second peak applied for a second time period, where the second peak is smaller than the first peak and the second period is longer than the first time period.

13 Claims, 13 Drawing Sheets

(56) References Cited

OTHER PUBLICATIONS

R. Sbiaa et al., "Materials with perpendicular magnetic anisotropy for magnetic random access memory", Physica Status Solidi RRL—Rapid Research Letters, Oct. 4, 2011, pp. 413-419, vol. 5, No. 12, WILEY-VCH Verlag GmbH & Co. KGaA, Weinheim.

M. Hosomi et al., "A Novel Nonvolatile Memory with Spin Torque Transfer Magnetization Switching: Spin-RAM" IEDM Tech Dig, 2005, pp. 1-4, vol. 459, IEEE.

Hai Li et al., "Performance, Power, and Reliability Tradeoffs of STT-RAM Cell Subject to Architecture-Level Requirement", IEEE Transactions on Magnetics, Oct. 2011, pp. 2356-2359, vol. 47, No. 10, IEEE.

Mu-Tien Chang et al., "Technology Comparison for Large Last-Level Caches ($L^3Cs$): Low-Leakage SRAM, Low Write-Energy STT-RAM, and Refresh-Optimized eDRAM", HPCA2013 2013 IEEE 19th Int. Symp. On High Perform. Comput. Archit., 2013, pp. 143-154, IEEE.

Y. Jiang et al., "Substantial reduction of critical current for magnetization switching in an exchange-biased spin valve", Nature Materials, Jun. 2004, pp. 361-364, vol. 3, Nature Publishing Group.

Shehzaad Kaka et al., "Spin transfer switching of spin valve nanopillars using nanosecond pulsed currents", Journal of Magnetism and Magnetic Materials, 2005, pp. 375-380, vol. 286, Elsevier B.V.

Koji Tsunekawa et al., "Giant tunneling magnetoresistance effect in low-resistance CoFeB/MgO(001)/CoFeB magnetic tunnel junctions for read-head applications," Applied Physics Letters, 2005, pp. 072503-1-072503-3, vol. 87, American Institute of Physics.

K Inomata et al., "Structural and magnetic properties and tunnel magnetoresistance for $Co_2(Cr,Fe)Al$ and $Co_2FeSi$ full-Heusler alloys", Jurnal of Physics D: Applied Physics, 2006, pp. 816-823, vol. 39, Institute of Physics Publishing.

S. Ikeda et al., "Tunnel magnetoresistance of 604% at 300 K by suppression of Ta diffusion in CoFeB/MgO/CoFeB pseudo-spin-valves annealed at high temperature", Applied Physics Letters, 2008, pp. 082508-1-082508-3, vol. 93, American Institute of Physics.

Shinji Isogami et al., "In situ heat treatment of ultrathin MgO layer for giant magnetoresistance ratio with low resistance area product in CoFeB/MgO/CoFeB magnetic tunnel junctions", Applied Physics Letters, 2008, pp. 192109-1-192109-3, vol. 93, American Institute of Physics.

A. Zaleski et al., "Reduction of critical current in magnetic tunnel junctions with CoFeB/Ru/CoFeB synthetic free layer", Journal of Physics: Conference Series, 2010, pp. 052035-1-052035-4, vol. 200, IOP Publishing.

Chun-Yeol You, "Dependence of the Spin Transfer Torque Switching Current Density on the Exchange Stiffness Constant", Applied Physics Express, 2012, pp. 103001-1-103001-3, vol. 5, The Japan Society of Applied Physics.

M.J. Donahue et al., "OOMMF User's Guide", Object Oriented MicroMagnetic Framework, Sep. 28, 2012, pp. 1-241.

Chun-Yeol You, "Micromagnetic Simulations for Spin Transfer Torque in Magnetic Multilayers", Journal of Magnetics, Jun. 2012, pp. 73-77, vol. 17, No. 2, Journal of Magnetics.

J.C. Slonczewski, "Current-driven excitation of magnetic multilayers", Journal of Magnetism and Magnetic Materials, 1996, pp. L1-L7, vol. 159, Elsevier Science B.V.

Shinji Yuasa et al., "Giant room-temperature magnetoresistance in single-crystal Fe/MgO/Fe magnetic tunnel junctions", Nature Materials, Dec. 2004, pp. 868-871, vol. 3, Nature Publishing Group.

* cited by examiner

FIG. 5 <PRIOR ART>

MAGNETIC MEMORY DEVICE WITH ENHANCED WRITE PERFORMANCE AND OPERATION METHOD THEREOF

CROSS-REFERENCE TO RELATED APPLICATION

The present application claims priority to Korean Patent Application No. 10-2017-0031561, filed on Mar. 14, 2017, which is incorporated herein by reference in its entirety.

BACKGROUND

1. Field

Embodiments of the present disclosure relate to a magnetic memory device, and more particularly, to a magnetic memory device having an improved write performance and an operation method thereof.

2. Description of the Related Art

Research on a spin transfer torque magnetic random-access memory (STT-MRAM) device including a magnetic tunnel junction (MTJ) has been actively conducted.

In particular, spin transfer torque magnetic memory devices having perpendicular magnetic tunnel junctions (pMTJs) are attracting attention as highly integrated non-volatile memory devices because of their high tunnel magnetoresistance and high thermal stability.

In addition to magnetic memory devices using an STT effect, magnetic memory devices using a spin orbit torque (SOT) effect and magnetic memory devices using the STT and SOT effects are being studied.

In a spin transfer torque magnetic memory device including an MTJ element, a write operation is performed on the MTJ element by changing a magnetization direction of a free layer included in the MTJ element using a torque generated by a write current. This is referred to as current induced magnetization switching (CIMS).

However, in order to change the magnetization direction of the free layer included in the MTJ element, a high-density write current is required.

When an excessive high write current is applied to the MTJ element in order to reduce a write time, the power consumption may be increased, and the possibility of damage to a barrier layer included in the MTJ element may be increased, which may shorten the life of the memory device including the MTJ element.

In order to compensate for the above drawbacks, a write operation may be performed by applying a low-density write current for a long time. In this case, however, the write performance of the memory device may be significantly degraded.

SUMMARY

Various embodiments are directed to a magnetic memory device, which can improve write performance and reduce power consumption without damaging a magnetic element in the magnetic memory device, and a method of operating the same.

In an embodiment, a magnetic memory device includes a magnetic element and a write circuit electrically connected to two nodes of the magnetic element and configured to provide a write current to the magnetic element, wherein the write current includes a first current having a first peak applied for a first time period and a second current having a second peak for a second time, where the second peak is smaller than the first peak and the second time period is longer than the first time period.

In an embodiment, an operation method of a magnetic memory device including a write circuit configured to provide write current to a magnetic element, the operation method includes providing the magnetic element with a first current having a first peak for a first time period at the beginning of a write operation of the magnetic memory device; and providing the magnetic element with a second current having a second peak for a second time period during the write operation, where the second peak is smaller than the first peak and the second period time is longer than the first time period.

DETAILED DESCRIPTION

Hereafter, various embodiments will be described below in more detail with reference to the accompanying drawings.

Figure 1:
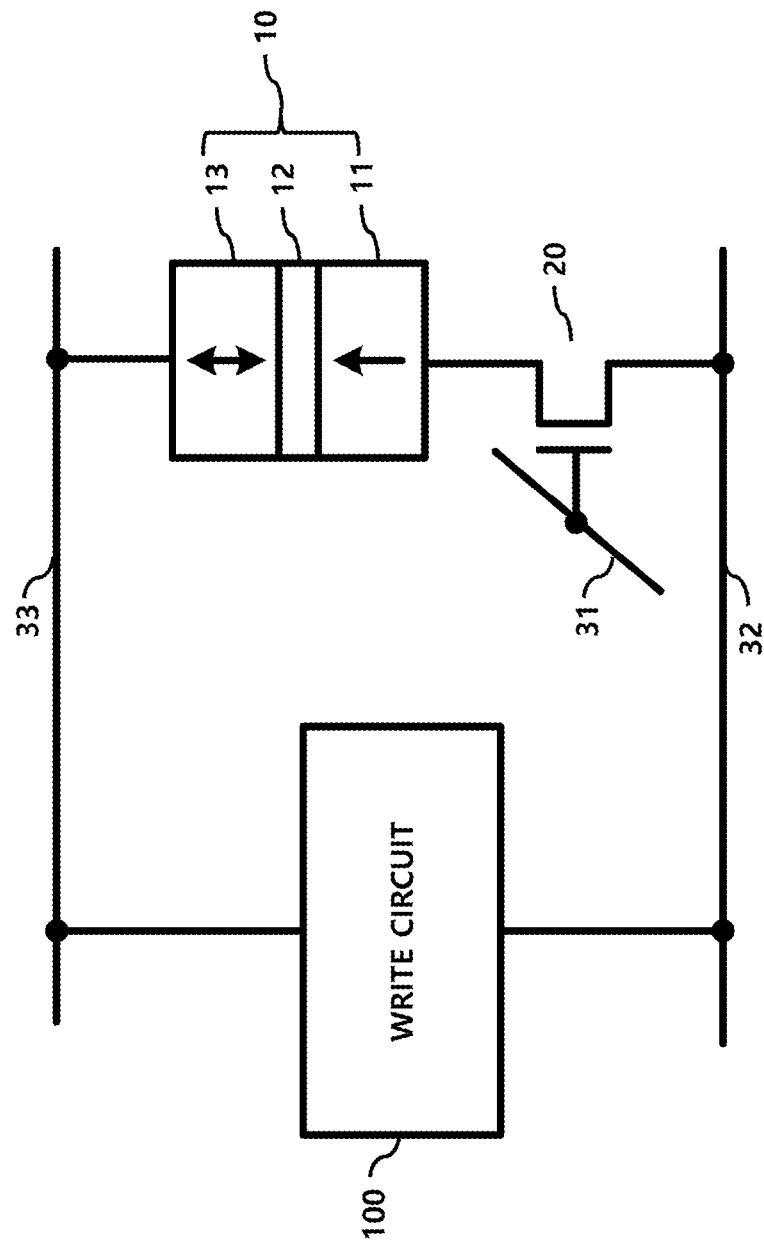
FIG. 1 illustrates a magnetic memory device according to an embodiment of the present disclosure.

FIG. 1 illustrates a magnetic memory device according to an embodiment of the present disclosure.

The magnetic memory device includes a magnetic element 10, a transistor switch 20, a word line 31, a source line 32, a write line 33, and a write circuit 100.

The write line 33 may be a bit line or a write line that is installed separately from a bit line. This will be described with reference to FIGS. 2 to 4.

The magnetic element 10 in this embodiment includes a fixed layer 11, a barrier layer 12, and a free layer 13.

Although a pMTJ element is an example of the magnetic element 10 in the present embodiment, the magnetic element may be an in-plane MTJ element according to various embodiments.

The magnetic element 10 may be a magnetic element utilizing an SOT effect, a magnetic element utilizing an STT effect, or a magnetic element utilizing the SOT and STT effects.

In this embodiment, the write circuit 100 provides a write current to the magnetic element 10 in a write operation. The write current includes a first current in the form of a pulse having a first peak and a second current in the form of a pulse having a second peak. In an embodiment, the first current is one of a square wave signal, a triangular wave signal, and an impulse signal.

The first current is provided only for a first time period tOST at the beginning of the write operation, and the second current is provided for a second time period tC during the write operation. This will be described with reference to FIG. 6.

The first current may be a square wave signal that remains at the first peak for a predetermined time period.

The predetermined time period during which the first current remains at the first peak can be shortened to reduce the possibility of damage to the magnetic element 10 due to the peak time of the first current.

In order to prevent the damage to the magnetic element 10, the first current may be a triangular wave signal or an impulse signal.

The second time period tC is preferably set to reach or exceed a switching point of time tSW at which the magnetic element 10 is switched by the write current.

The operation of the write circuit 100 will be described.

Figure 2:
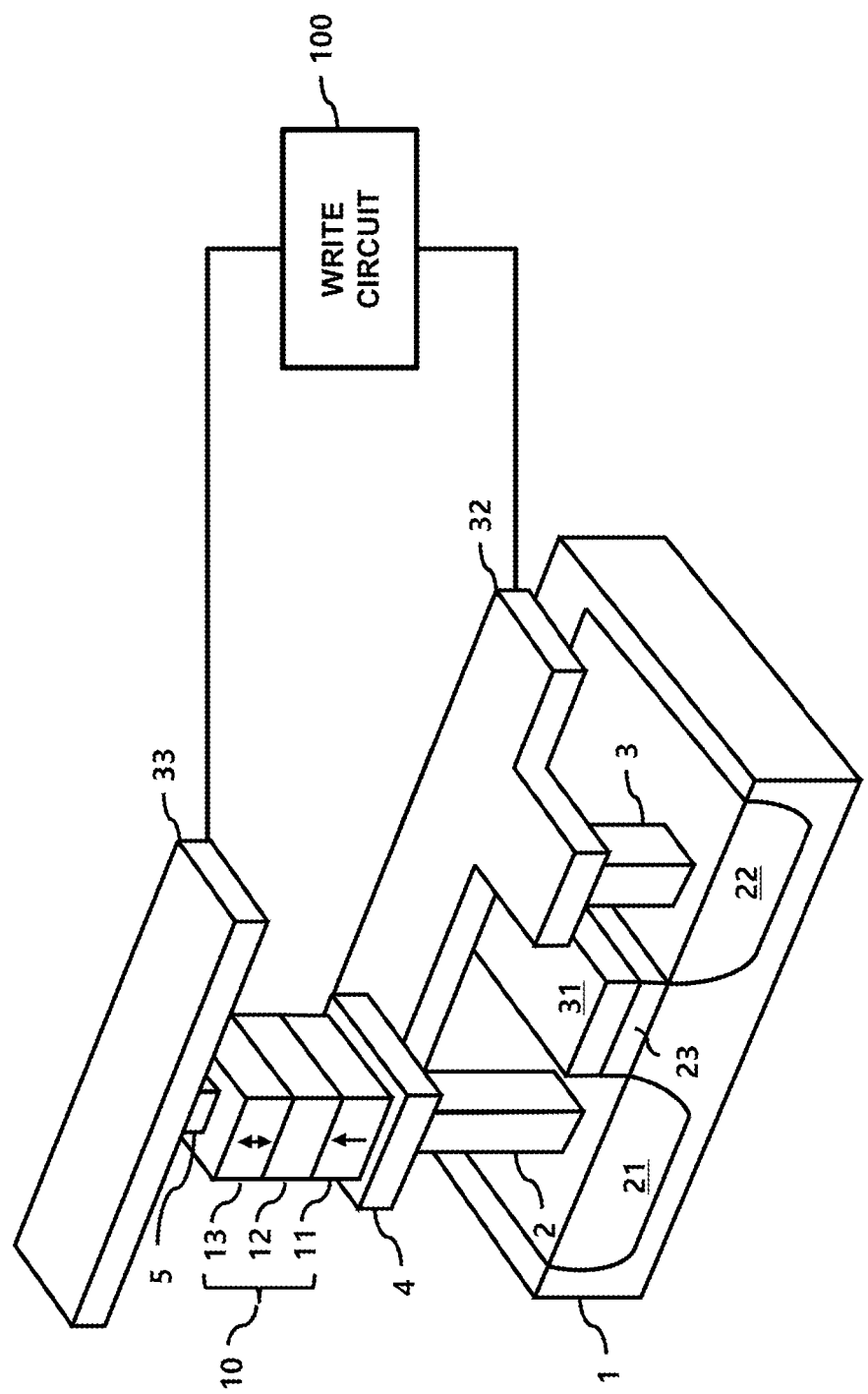
FIG. 2 illustrates a magnetic memory device using an STT effect according to an embodiment of the present disclosure.

FIG. 2 illustrates a magnetic memory device using an STT effect according to an embodiment of the present disclosure.

In FIG. 2, the magnetic memory device includes a word line 31 formed over a substrate 1, a drain 21 and a source 22 that are formed in the substrate 1 at opposite sides of the word line 31, and a gate insulation layer 23 formed between the substrate 1 and the word line 31 in a vertical direction, which may be perpendicular to a main surface of the substrate 1.

The magnetic memory device further includes a drain electrode 2, a source electrode 3, a metal layer 4, an electrode 5, a write line 33, and a source line 32. The drain electrode 2 is formed on the drain 21, and the source electrode 3 is formed on the source 22. The metal layer 4, the electrode 5, and the write line 33 are sequentially formed on the drain electrode 2 in the vertical direction. The source line 32 is formed on the source electrode 3 in the vertical direction.

In this embodiment, the write line 33 corresponds to a bit line.

In other embodiments, at least one of the metal layer 4 and the electrode 5 may be omitted.

The magnetic memory device further includes a magnetic element 10. The magnetic element 10 includes a fixed layer 11, a barrier layer 12, and a free layer 13. The magnetic element 10 is formed between the metal layer 4 and the electrode 5 in the vertical direction.

Data is written into the magnetic element 10 by controlling a spin direction of the free layer 13 of the magnetic element 10, which is performed by applying a write current passing through the magnetic element 10. Data stored in the magnetic element 10 is read out according to a resistance or current difference that occurs according to the spin direction of the free layer 13 when the STT effect is used.

The write circuit 100 provides the write current between the write line 33 and the source line 32 during a write operation.

Figure 3:
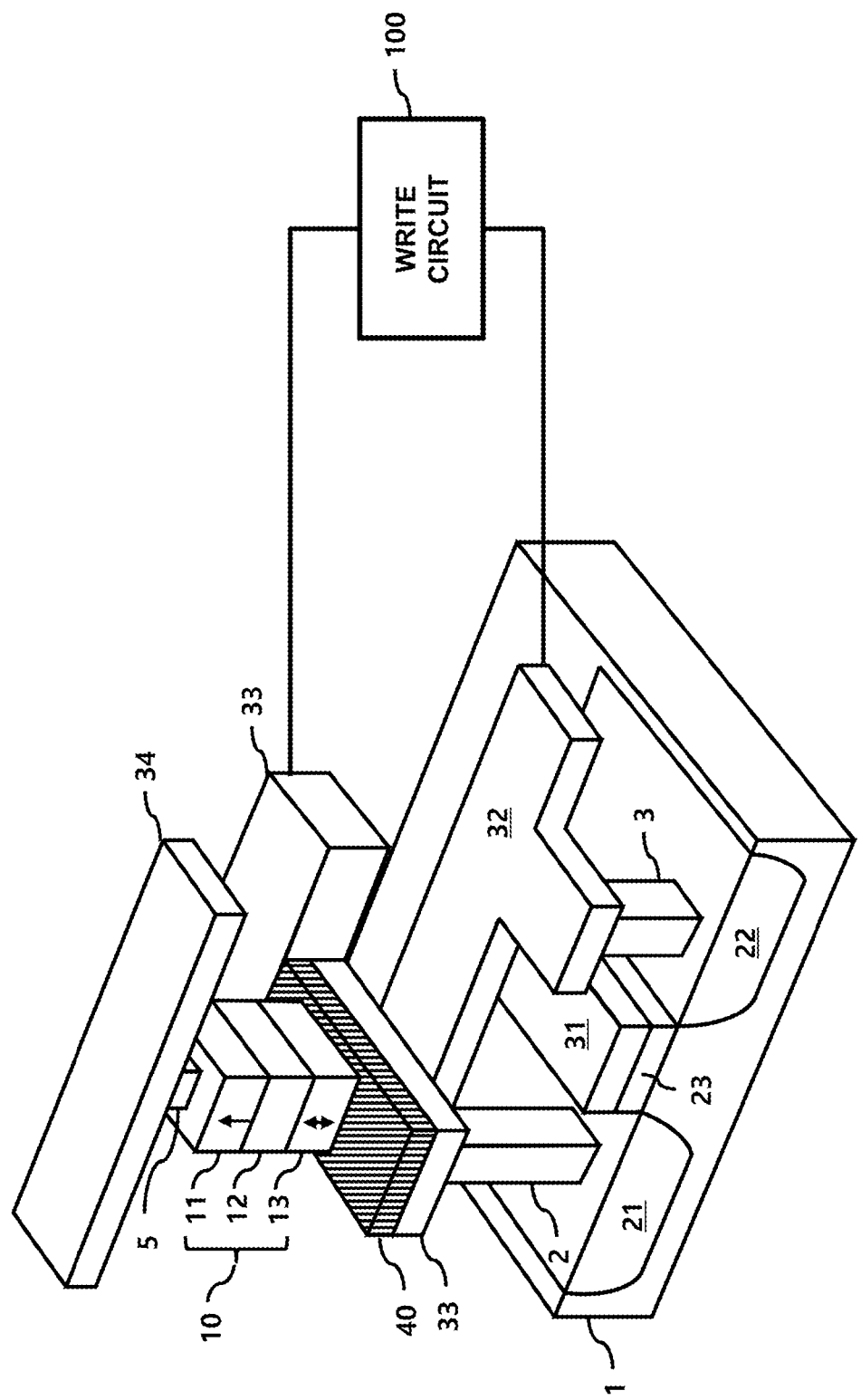
FIG. 3 illustrates a magnetic memory device using an SOT effect according to an embodiment of the present disclosure.

FIG. 3 illustrates a magnetic memory device using an SOT effect according to an embodiment of the present disclosure.

In FIG. 3, the magnetic memory device includes a word line 31, which is formed over a substrate 1; a drain 21 and a source 22, which are formed in the substrate 1 at opposite sides of the word line 31; and a gate insulation layer 23, which is formed between the substrate 1 and the word line 31 in a vertical direction perpendicular to a main surface of the substrate 1.

The magnetic memory device further includes a drain electrode 2, a source electrode 3, a write line 33, a magnetic element 10, an electrode 5, a bit line 34, and a source line 32. The drain electrode 2 is formed on the drain 21, and the source electrode 3 is formed on the source 22. The write line 33, the magnetic element 10, the electrode 5, and the bit line 34 are sequentially formed over the drain electrode 2. The source line 32 is formed on the source electrode 3.

In this embodiment, the write line 33 is distinguished from the bit line 34. In addition, the bit line 34 is inactive in a write operation, but is active only in a read operation.

The magnetic element 10 includes a fixed layer 11, a barrier layer 12, and a free layer 13.

The magnetic memory device further includes a spin Hall effect material layer 40. The spin Hall effect material layer 40 is formed between the write line 33 and the free layer 13 of the magnetic element 10 in the vertical direction, and is laterally adjacent to the write line 33.

In another embodiment, the electrode 5 may be omitted.

The write circuit 100 provides a write current between the write line 33 and the source line 32 during a write operation.

A spin Hall effect is generated in the spin Hall effect material layer 40 by a current that flows through the free layer 13 of the magnetic element 10 and the write line 33, so that a spin direction of the free layer 13 is switched and the write operation is performed.

A current flows through the bit line 34, the magnetic element 10, and the source line 32 in a read operation.

In the read operation, data is determined by a resistance or a current difference generated according to the spin direction of the free layer 13.

Figure 4:
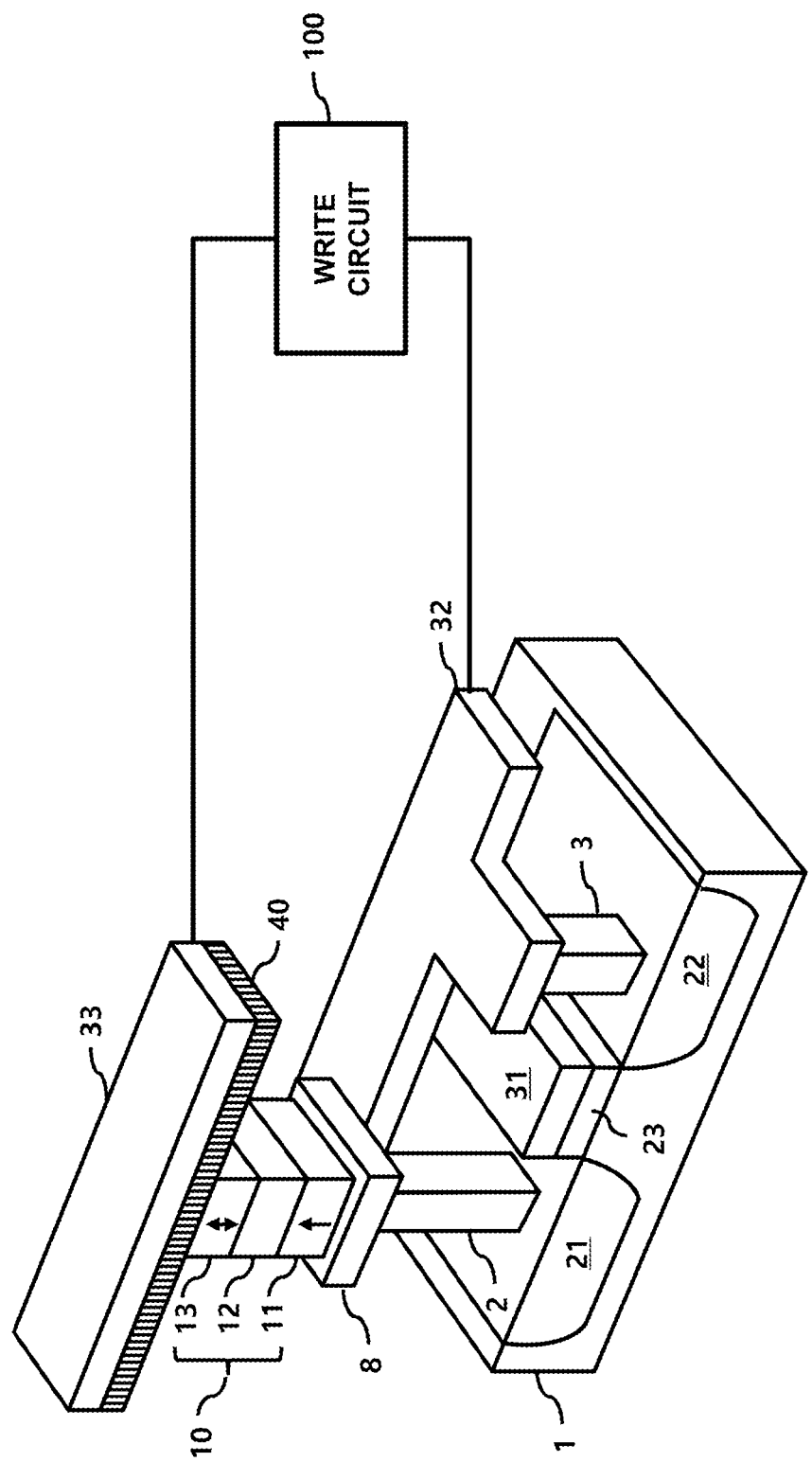
FIG. 4 illustrates a magnetic memory device using an STT effect and an SOT effect according to an embodiment of the present disclosure.

FIG. 4 illustrates a magnetic memory device using an STT effect and an SOT effect according to an embodiment of the present disclosure.

In FIG. 4, the magnetic memory device comprises a word line 31, which is formed over a substrate 1; a drain 21 and a source 22, which are formed in the substrate 1 at opposite sides of the word line 31; and a gate insulation layer 23, which is formed between the substrate 1 and the word line 31 in a vertical direction perpendicular to a main surface of the substrate 1.

The magnetic memory device further includes a source electrode 3 formed on the source 22, and a drain electrode 2 formed on the drain 21.

The magnetic memory device further includes a metal layer 8, a magnetic element 10, a write line 33, and a source line 32. The metal layer 8, the magnetic element 10, and the write line 33 are sequentially formed over the drain electrode 2 in the vertical direction. The source line 32 is formed on the source electrode 3.

The magnetic memory device further includes a spin Hall effect material layer 40, which is formed under the write line 33 and over the magnetic element 10.

The magnetic element 10 includes a fixed layer 11, a barrier layer 12, and a free layer 13. The free layer 13 in the magnetic element 10 is formed adjacent to the spin Hall effect material layer 40 in the vertical direction, and the fixed layer 11 is formed adjacent to the metal layer 8 in the vertical direction. In this embodiment, the free layer 13 contacts the spin Hall effect material layer 40, and the fixed layer 11 contacts the metal layer 8.

In this embodiment, the write line 33 corresponds to a bit line and can be used for both a read operation and a write operation.

In another embodiment, the metal layer 8 may be omitted.

The write circuit 100 applies a write current between the write line 33 and the source line 32 during the write operation.

In the embodiment of FIG. 4, the write current includes a horizontal current and a vertical current. The horizontal current flows in the free layer 13 in a horizontal direction, and the vertical current flows through the free layer 11 in the vertical direction. The horizontal direction may be parallel to a top surface of the write line 33 with respect to the orientation of FIG. 4.

In this embodiment, a spin direction of the free layer 11 is adjusted by a spin orbit torque due to the horizontal current and a spin transfer torque due to the vertical current, so that the write operation can be performed.

Hereinafter, an operation of the write circuit 100 will be described with reference to the magnetic memory device using the STT effect that is shown in FIG. 2.

Figure 5:
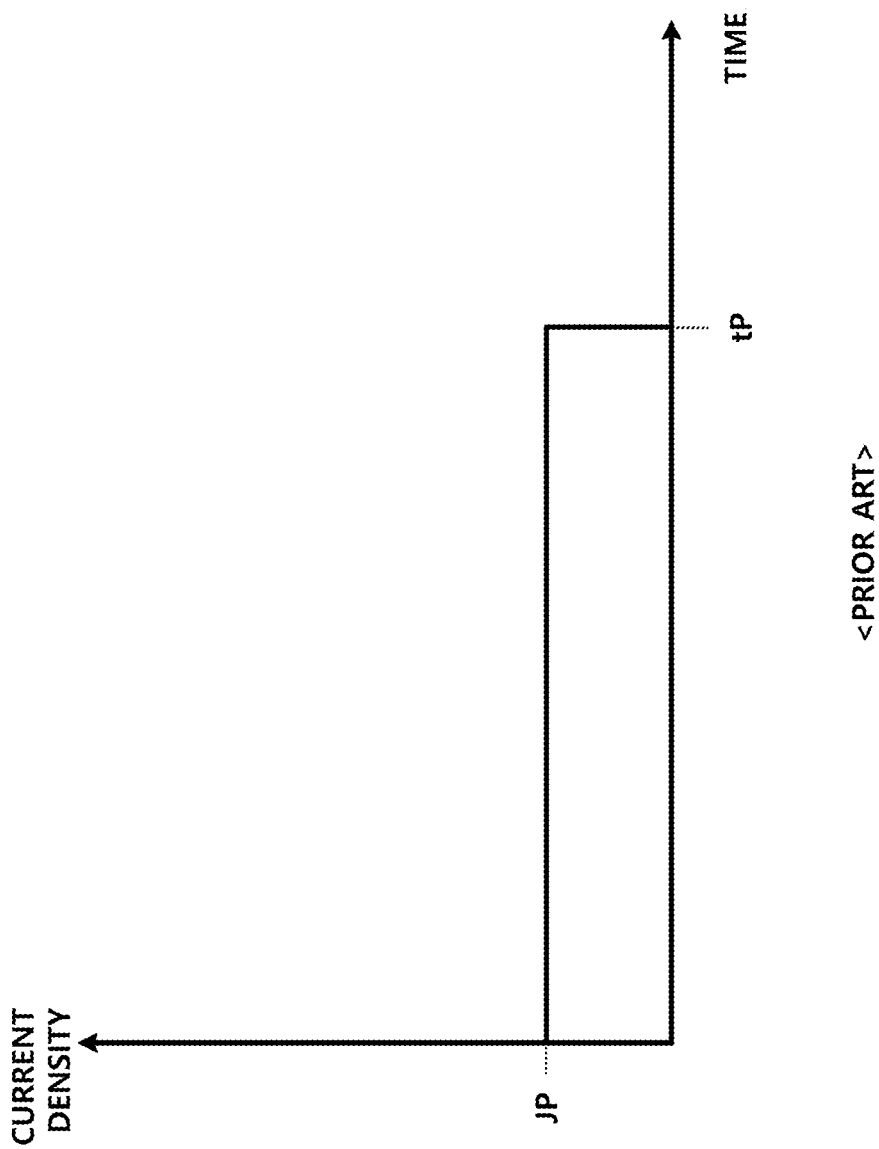
FIG. 5 is a waveform diagram illustrating a write current provided by a conventional write circuit.

FIG. 5 is a waveform diagram illustrating a write current provided by a conventional write circuit.

The conventional write circuit performs a write operation by applying a constant current JP for a predetermined time period tP.

Figure 6:
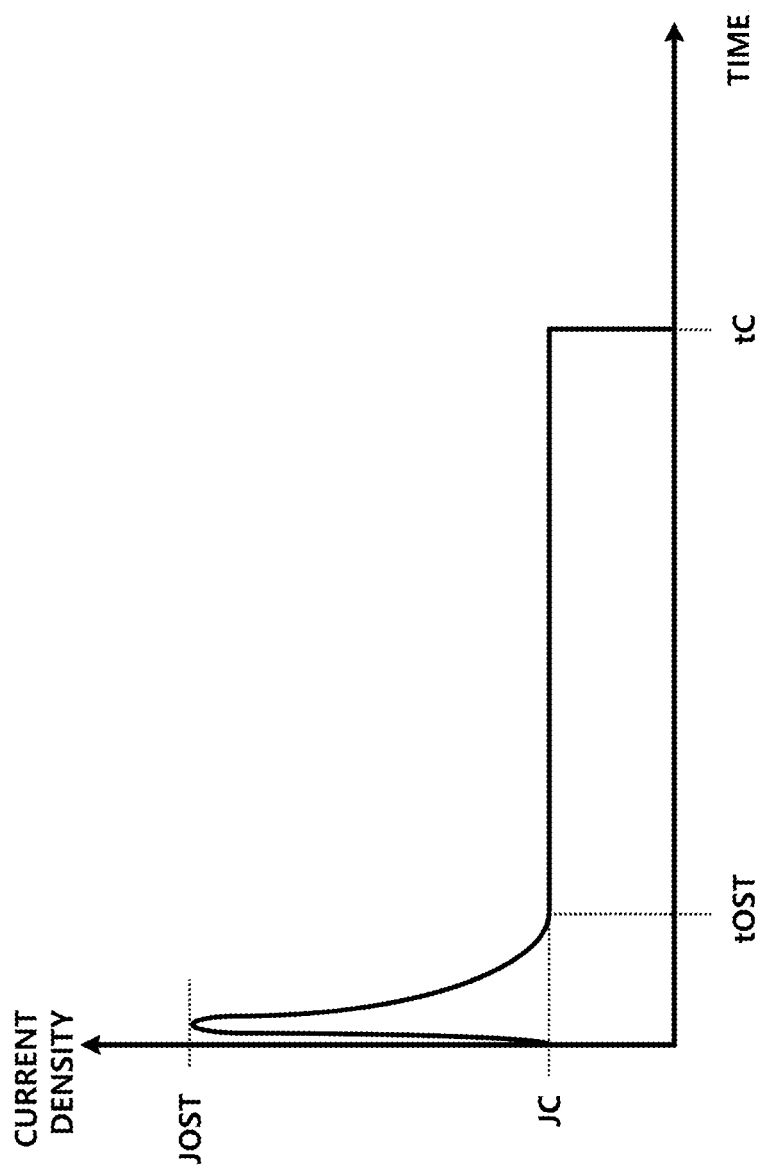
FIG. 6 is a waveform diagram illustrating a write current provided by a write circuit according to an embodiment of the present disclosure.

FIG. 6 is a waveform diagram illustrating a write current provided by a write circuit according to an embodiment of the present disclosure.

As described above, in this embodiment, the write circuit 100 provides a write current in a write operation, and the write current includes a first current having a first peak JOST and a second current having a second peak JC.

The second peak JC is smaller than the first peak JOST, and the first current is provided for a time period tOST at the beginning of the write operation. In an embodiment, the first peak JOST is greater than twice of the second peak JC. In another embodiment, the first peak JOST is greater than 2.7 times of the second peak JC.

The time period tOST for which the first current is provided may be referred to as a first time period or a pulse width. In an embodiment, the first time period tOST is equal to or greater than 400 ps.

Also, in order to reduce the damage of a magnetic element, it is preferable to reduce a time period for which the first current maintains the first peak JOST as short as possible. Therefore, it is preferable that a shape of the first current is close to an impulse.

Simulations were performed by apply an Object Oriented Micro-Magnetic Framing (OOMF) tool on a cylindrical pMTJ element. The cylindrical pMTJ element includes a free layer having a thickness of 1 nm and a fixed layer having a thickness of 2 nm and a radius of 20 nm.

Other parameters used in the simulations are shown in Table 1 below.

TABLE 1

| Parameters | Numerical Values |
| --- | --- |
| Saturation Magnetization | $1.1 \times 10^6$ (A/m) |
| Magnetic anisotropy of free layer | $9.3 \times 10^5$ (J/m3) |
| Magnetic anisotropy of fixed layer | $1.2 \times 10^6 \sim 2.4 \times 10^6$ (J/m3) |
| Mesh size | 1 nm × 1 nm × 1 nm |
| Temperature | 0 K |
| Pulse Width of write current | 10 ns |
| Damping constant | 0.02 |
| Spin-torque efficiency | 0.7 |

Simulation results show that the first peak JOST of the first current has a major influence on a magnetic switching of the free layer during the first time period tOST, which is when the first current is provided.

Experimental results describe that a switching time is reduced by 80% and the total power consumption is reduced by 9% when the first current is applied together with the second current as shown in FIG. 6.

This observed effect is due to the spin precession of the free layer generated by the first current.

Hereinafter, experimental results will be described in detail.

FIGS. 7 to 12 are graphs illustrating simulation results according to embodiments of the present disclosure.

Figure 7:
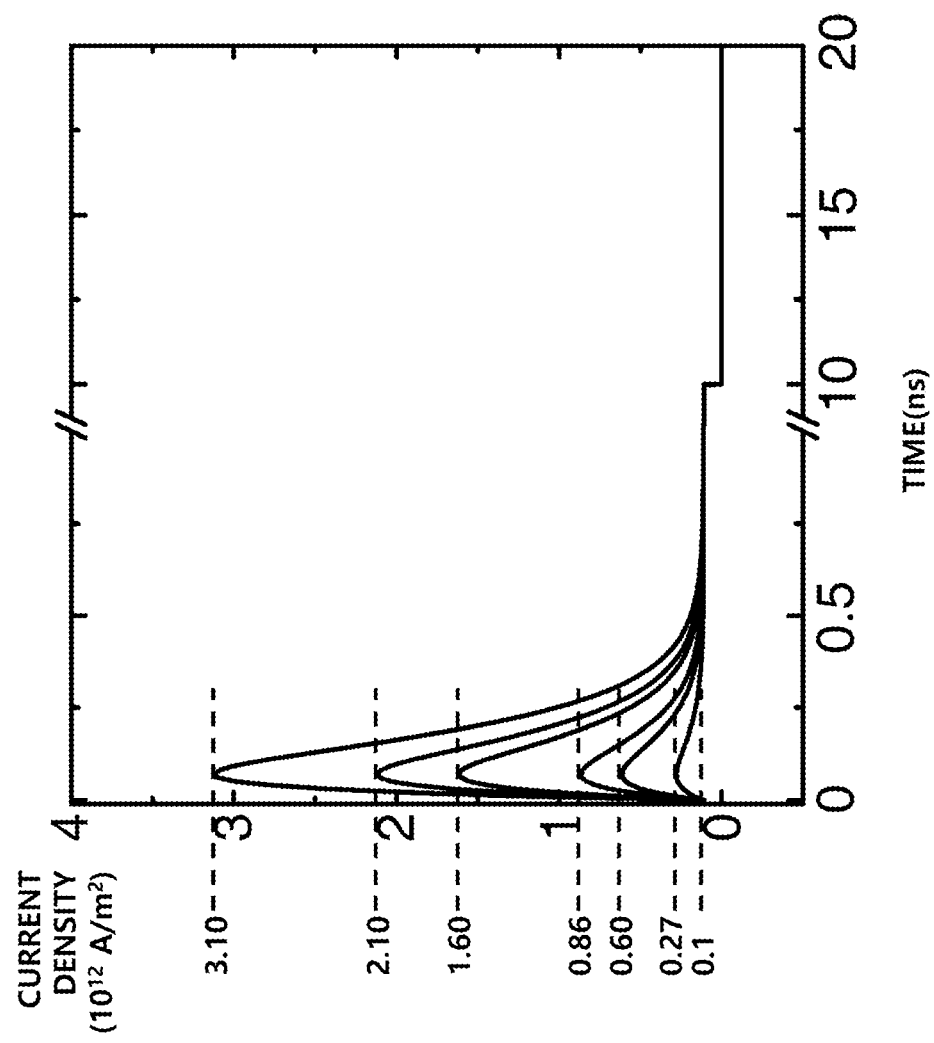
FIGS. 7 to 12 are graphs illustrating simulation results according to embodiments of the present disclosure.
Figure 8:
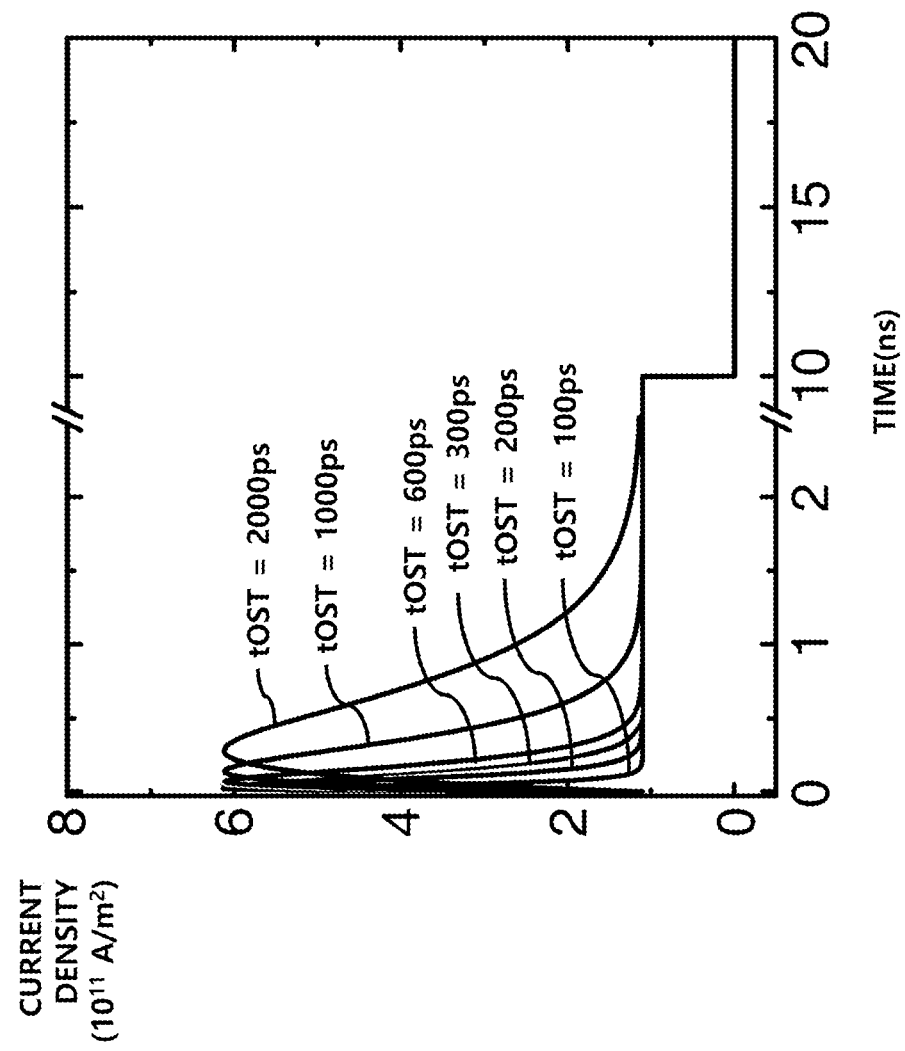

FIGS. 7 and 8 show various waveforms of the write current used in experiments.

FIG. 7 shows the write current when the first time period tOST, in which the first current is supplied, is fixed at 600 ps and the size of the first peak JOST of the first current variously changes.

During the first time period tOST, the second peak JC is fixed at $1.1 \times 10^{11}$ A/m$^2$. A second time period tC, during the write operation, is fixed at 10 ns.

At this time, the second peak JC is fixed at $1.1 \times 10^{11}$ A/m$^2$ and the second time period tC is fixed at 10 ns.

When the write current of $1.1 \times 10^{11}$ A/m$^2$ is constantly applied as shown in FIG. 5, a switching time of the corresponding magnetic element was measured at 9.98 ns (Experiment 1).

Experimental results of the Experiment 1 show that a disturbance occurred in a fixed layer when the write current of $2.5 \times 10^{11}$ A/m$^2$ or more was constantly applied, as shown in FIG. 5. If the disturbance occurs in the fixed layer, the magnetic element does not operate normally.

The experimental results also show that a disturbance occurs in the fixed layer when the first current of $8.5 \times 10^{11}$ A/m$^2$ or more was applied and the first current was applied for 600 ps as shown in FIG. 6.

From the above experiments, it was confirmed that the normal operation of the magnetic element can be ensured when the size of the first peak JOST is sufficiently increased and the first current has an impulse shape.

The switching time was measured at 8.94 ns when the first current having the first peak JOST of $2.7 \times 10^{11}$ A/m$^2$ was applied for 600 ps (Experiment 2). In the Experiment 2, the write time was reduced by about 10%, as compared to the write time when the switching time was 9.98 ns. The switching time of 9.98 ns was measured when the second current having the second peak of $1.1 \times 10^{11}$ A/m$^2$ was applied without the first current being applied.

However, in Experiment 2, the power consumption was increased by 3% due to the first current.

In another experiment, the second current was provided without providing the first current (Experiment 3). In Experiment 3, the second peak of the second current was $1.0 \times 10^{11}$ A/m$^2$.

In this case, there was no significant change in the switching time, but the power consumption was reduced by 9%.

In Experiment 4, the first time period tOST was fixed at 600 ps, the first peak JOST was increased to $6.1 \times 10^{11}$ A/m$^2$, and the other conditions remained unchanged from Experiment 3.

In the Experiment 4, the switching time was reduced by 80%, and the power consumption was reduced by 9%.

It has been confirmed from the above experiments that by increasing the first peak JOST, the switching time can be remarkably reduced. The above experiments also confirm that it is possible to reduce the power consumption by sufficiently raising the first peak JOST.

The following Table 2 summarizes the above experiments.

TABLE 2

|  | Experiment 1 | Experiment 2 | Experiment 3 | Experiment 4 |
|---|---|---|---|---|
| JOST ($10^{11}$ A/m$^2$) | — | 2.7 | 2.7 | 6.1 |
| tOST (ns) | — | 600 | 600 | 600 |
| JC ($10^{11}$ A/m$^2$) | 1.1 | 1.1 | 1.0 | 1.1 |
| Change in switching time | — | −10% | — | −80% |
| Change in power consumption during switching | — | +3% | −9% | −9% |

In a further experiment shown in FIG. 8, the size of the first peak JOST was fixed at $6.1 \times 10^{11}$ A/m$^2$ and the first time period tOST was varied from 100 ps to 2000 ps.

At this time, the size of the second peak JC was fixed at $1.1 \times 10^{11}$ A/m$^2$.

Figure 9:
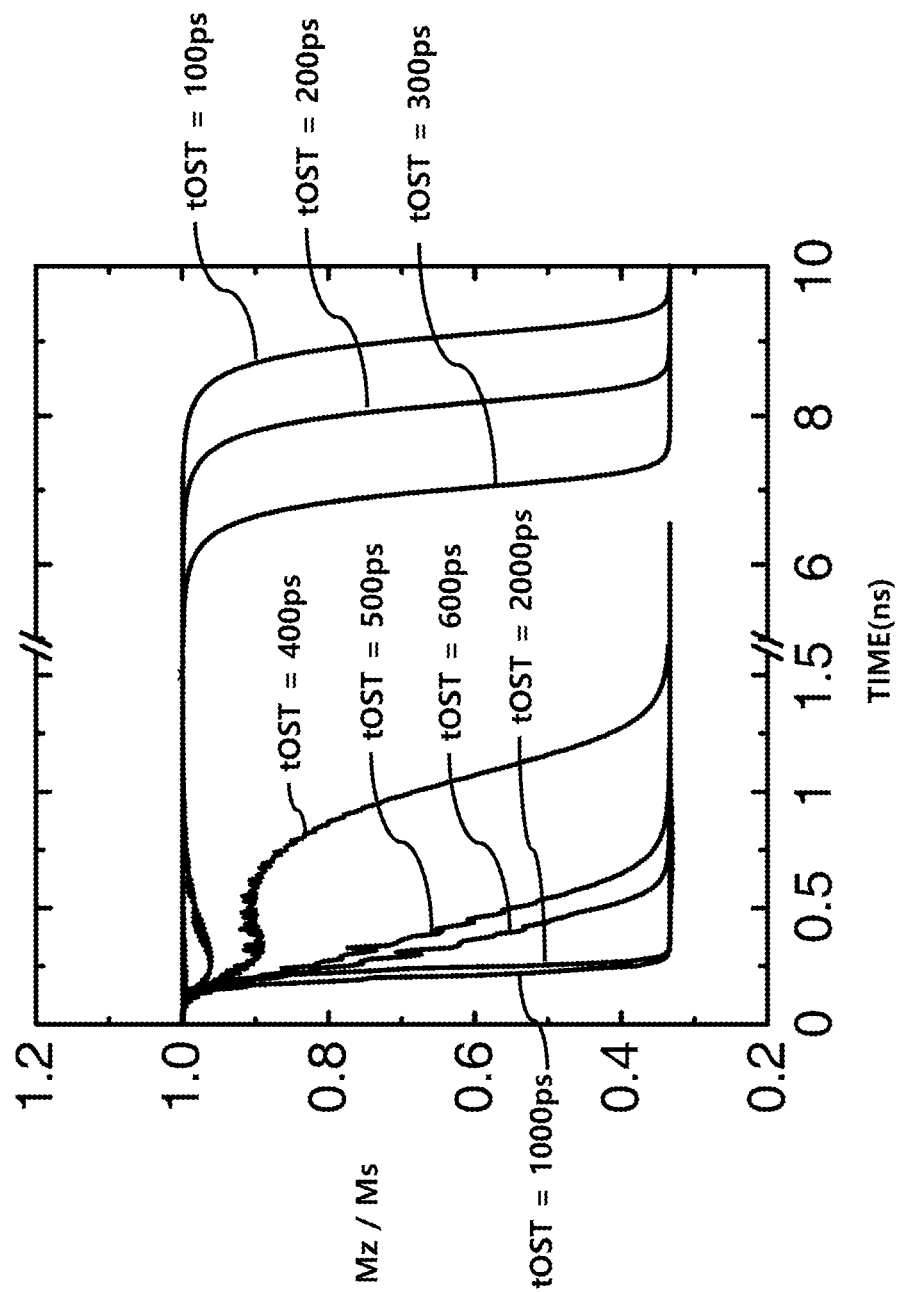

FIG. 9 is a graph showing switching times when the first peak JOST is fixed and the first time period tOST is variously adjusted.

As shown in the drawing, when the first time period tOST is relatively short (for example, (a) 100 ps, (b) 200 ps, or (c) 300 ps), the reduction of the switching time is rather small, but, when the first time period tOST is relatively long (for example, (d) 1000 ps), the switching time was greatly reduced.

Thereafter, when the first time period tOST is longer (for example, (e) 2000 ps), there is almost no change in the switching time.

Figure 10:
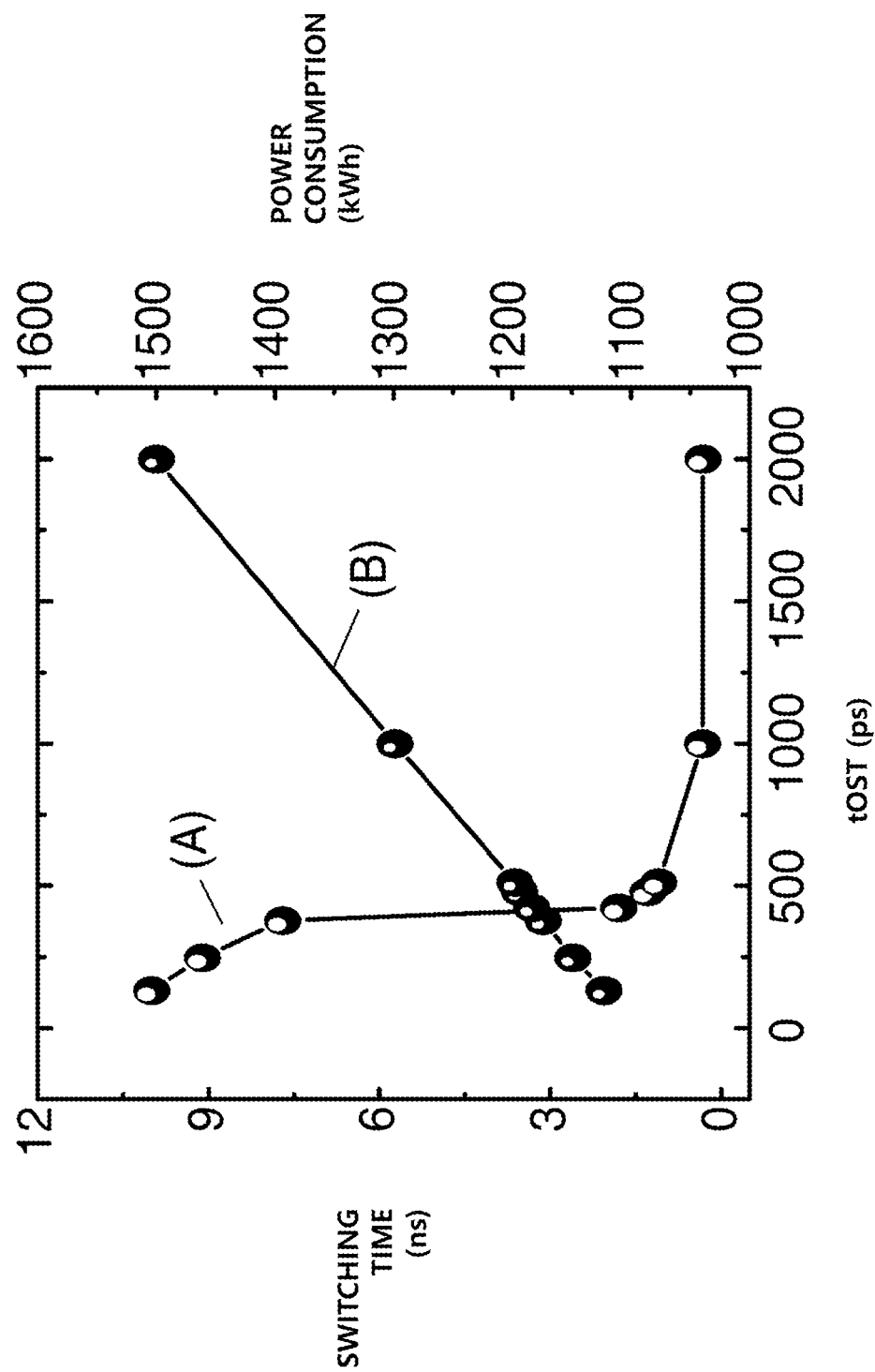

FIG. 10 is a graph showing a change in a switching time and power consumption according to the variation of the first time period tOST shown in FIG. 9.

As described with reference to FIG. 9, the switching time decreases as the first time period tOST increases. This is indicated by a graph (A) in FIG. 10.

However, when the first time period tOST increases, the power consumption during the switching tends to increase. This is indicated by a graph (B) in FIG. 10.

Accordingly, it is preferable to select the first time period tOST so as to reduce the switching time and the power consumption.

For example, referring to FIG. 10, when the first time period tOST is selected to be 400 ps or more at which the switching time is greatly reduced, it is predicted that the power consumption can be reduced to a certain level.

Figure 11:
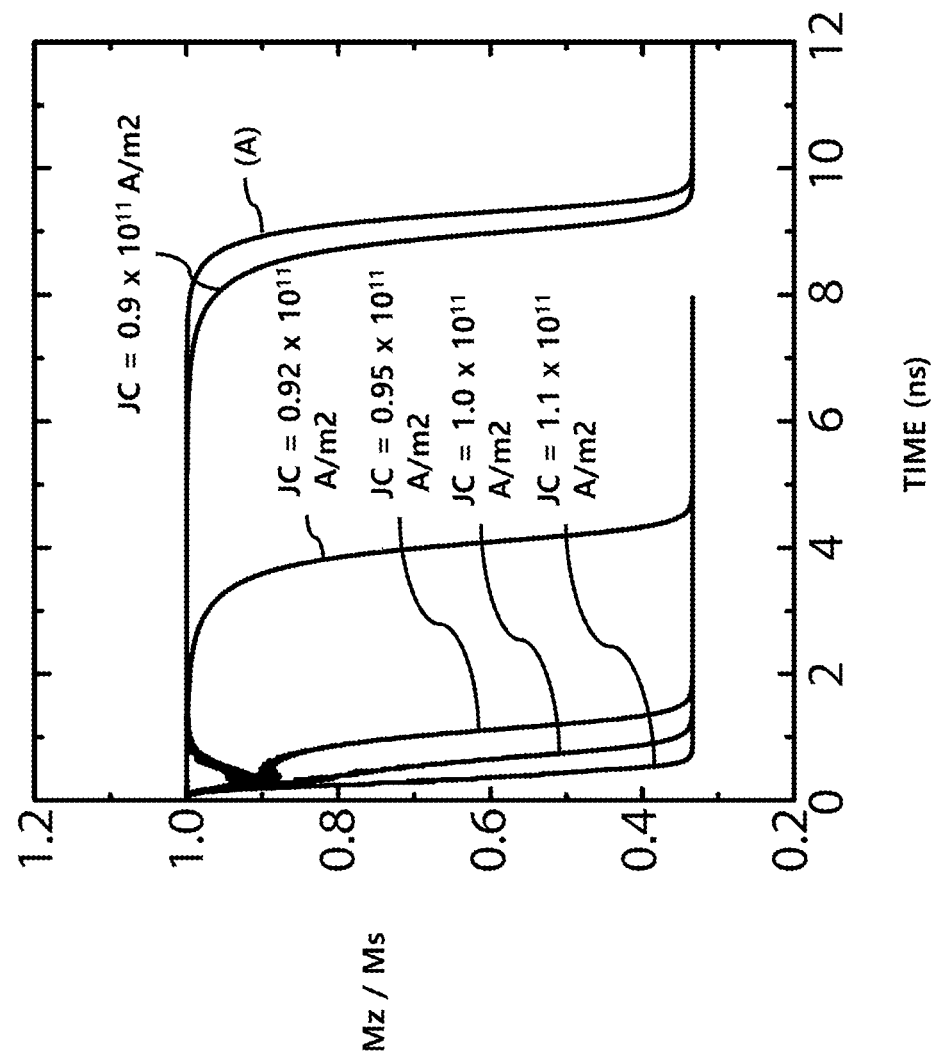

FIG. 11 is a graph showing a switching time according to the variation of a second peak JC when the first peak JOST of the first current is fixed at $6.1 \times 10^{11}$ A/m$^2$ and the first time period tOST is fixed at 600 ps.

In FIG. 11, a waveform (A) represents a case where the second peak JC is provided at $1.1 \times 10^{11}$ A/m$^2$ without the first current being provided. In this case, the switching is performed at 9.98 ns.

As can be seen from FIG. 11, as the second peak JC decreases from $1.1 \times 10^{11}$ A/m$^2$ to $9.0 \times 10^{10}$ A/m$^2$, the switching time increases sharply.

Figure 12:
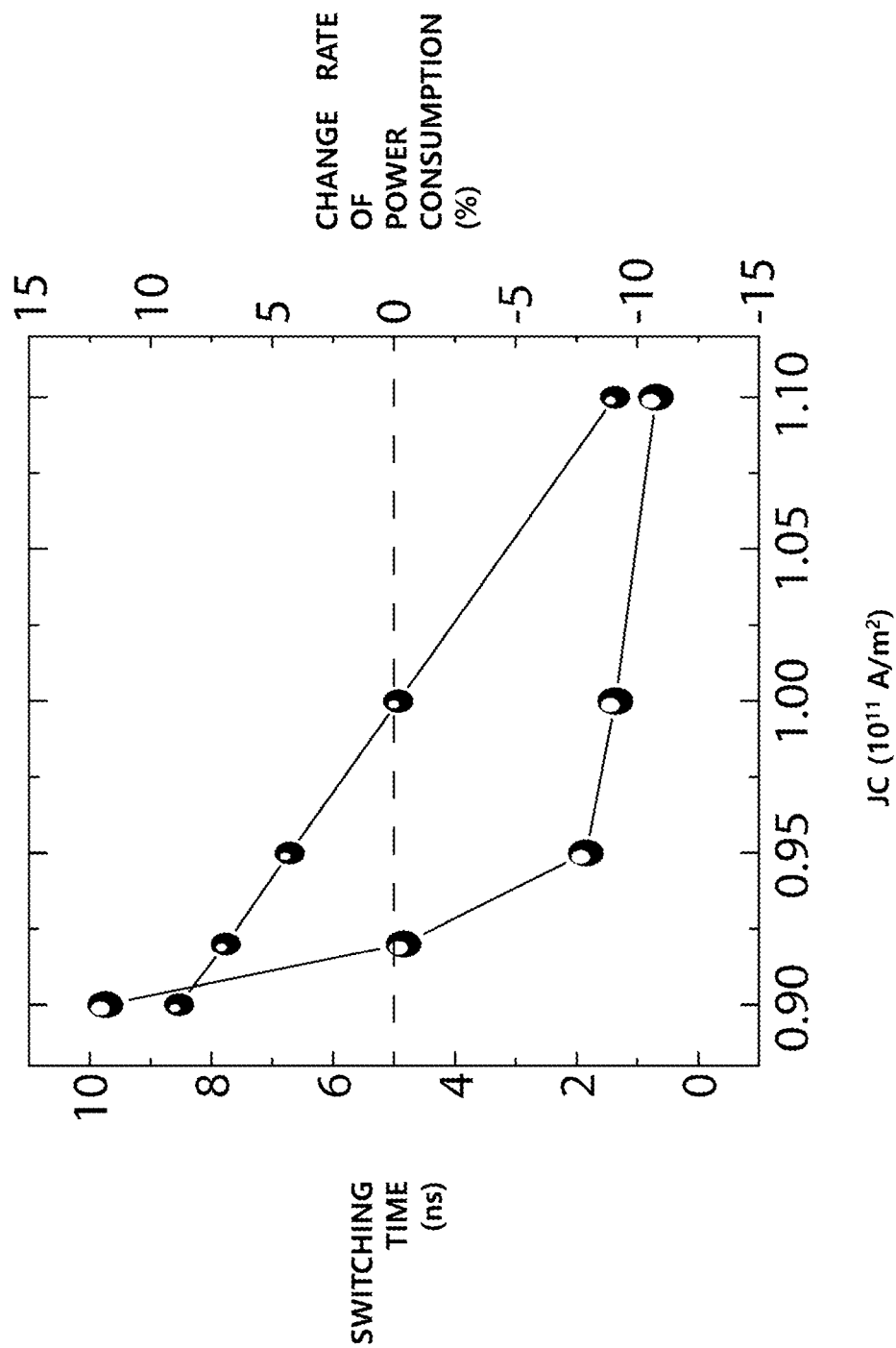

FIG. 12 shows the switching time and the power consumption in the case of FIG. 11.

As can be seen from FIG. 12, as the second peak JC decreases, the switching time increases sharply and the power consumption increases gradually.

As described above, it can be seen that by applying the first current in the pulse form before providing the second current to the magnetic element in the write operation, the switching time can be greatly reduced and the power consumption can be reduced.

Figure 13:
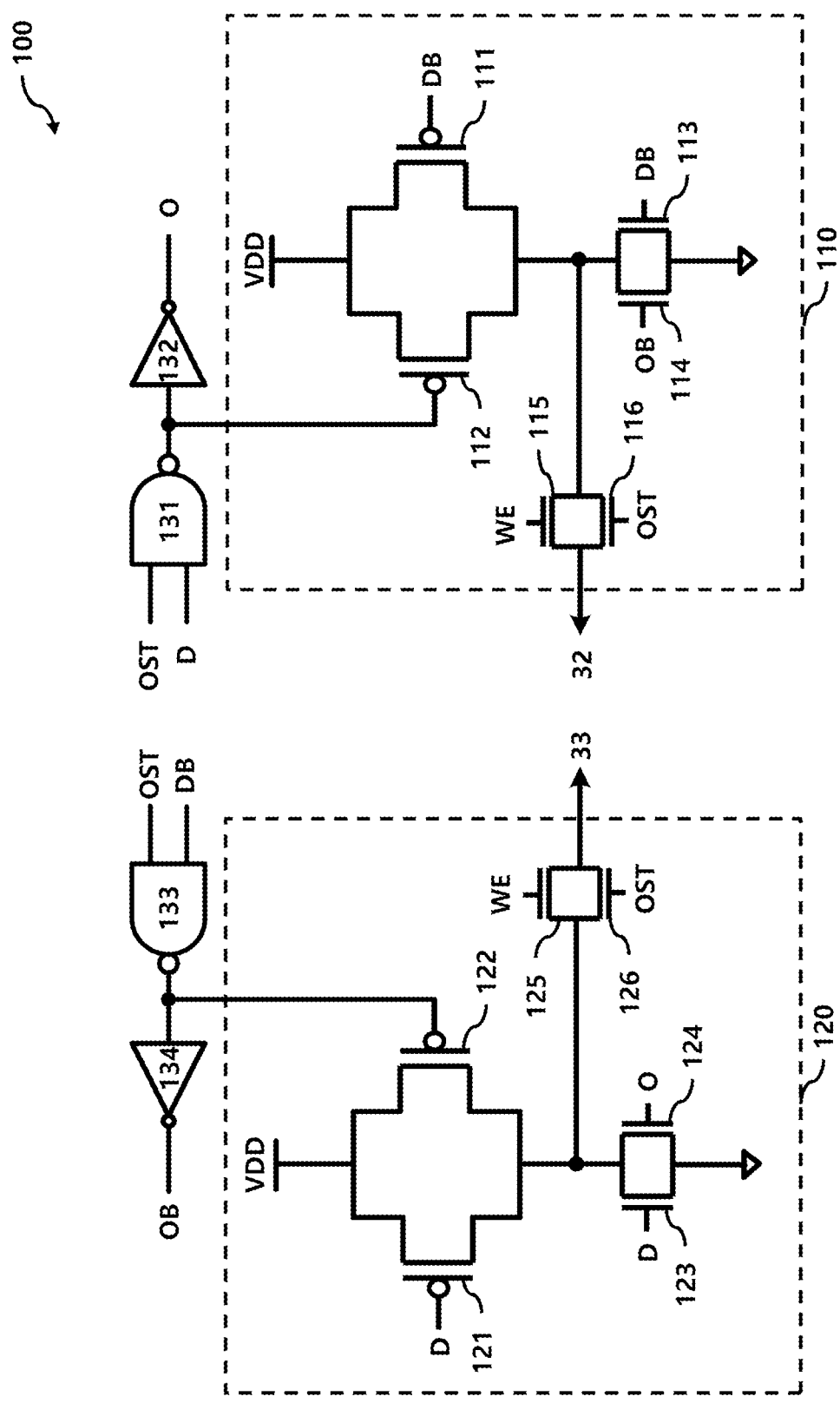
FIG. 13 is a circuit diagram of a write circuit of FIG. 1 according to an embodiment of the present disclosure.

FIG. 13 is a circuit diagram of the write circuit 100 of FIG. 1 according to an embodiment of the present disclosure.

The write circuit 100 includes a first write circuit 110 and a second write circuit 120.

The first write circuit 110 and the second write circuit 120 may have substantially the same configuration.

When a data signal D is at a high level, the first write circuit 110 sources a write current and the second write circuit 120 sinks the write current.

When the data signal D is at the high level, the write current flows from the source line 32 to the write line 33 through the magnetic element 10.

Conversely, when the data signal D is at a low level, the second write circuit 120 sources the write current, and the first write circuit 110 sinks the write current.

When the data signal D is at the low level, the write current flows from the write line 33 to the source line 32 via the magnetic element 10.

When a write enable signal WE is inactivated, the write current is not provided since a pulse signal OST is also inactivated.

When the write enable signal WE is activated, the pulse signal OST is activated to provide a first current, and then is inactivated after a first time period tOST has elapsed.

First, the operation when the data signal D is at the high level will be described.

When the data signal D is at the high level, a PMOS transistor 111 of the first write circuit 110 is turned on, because the PMOS transistor 111 receives an inverted data signal DB having the low level through a gate thereof.

A NAND gate 131 receiving the data signal D and the pulse signal OST turns on a PMOS transistor 112 of the first write circuit 110 while the pulse signal OST is activated.

Accordingly, the PMOS transistor 111 provides the second current having the second peak JC. The PMOS transistor 112 additionally provides a current corresponding to a difference between the first peak JOST and the second peak JC.

That is, the PMOS transistors 111 and 112 provide the first current having the first peak JOST while the pulse signal OST is activated, and the PMOS transistor 111 provides the second current having the second peak JOST while the pulse signal OST is inactivated.

In this embodiment, the PMOS transistor 112 is preferably designed to be larger than the PMOS transistor 111, in order to provide a larger current than the PMOS transistor 111.

When the data signal D is at the high level, an output signal OB of an inverter 134 has the low level.

Thus, switching transistors 113 and 114 of the first write circuit 110, which are controlled by the inverted data signal DB and the output signal OB of the inverter 134, respectively, are all turned off.

At this time, switching transistors 115 and 125 are turned on by the write enable signal WE irrespective of the pulse signal OST.

Switching transistors 116 and 126 are turned on while the pulse signal OST is activated.

The switching transistors 116 and 126 are preferably designed to be larger than the switching transistors 115 and 125, so as to allow a larger write current to flow.

While the data signal D is at the high level, an output signal O of an inverter 132 has the high level when the pulse signal OST is at the high level.

Accordingly, a switching transistor 124 of the second write circuit 120 is turned on in response to the output signal O having the high level. That is, the switching transistor 124 is turned on when the data signal D is at the high level and the pulse signal OST is activated to the high level.

Similarly, in the second write circuit 120, the switching transistor 124 is preferably designed to be larger than a switching transistor 123, in order to allow a larger write current to flow.

Next, the operation when the data signal D is at the low level will be described.

A PMOS transistor 121 of the second write circuit 120 is turned on regardless of whether the pulse signal OST is at the high level or the low level because the PMOS transistor 121 receives the data signal D at the low level through a gate of the PMOS transistor 121.

A NAND gate 133 receiving the inverted data signal DB and the pulse signal OST turns on a PMOS transistor 122 of the second write circuit 120 while the pulse signal OST is activated.

The PMOS transistor 121 provides the second current, which has the second peak JC. The PMOS transistor 122 further provides the current corresponding to the difference between the first peak JOST and the second peak JC.

That is, the PMOS transistors 121 and 122 provide the first current having the first peak JOST while the pulse signal OST is activated, and the PMOS transistor 121 provides the second current having the second peak JOST while the pulse signal OST is inactivated.

In this embodiment, the PMOS transistor 122 is preferably designed to be larger than the PMOS transistor 121, so as to provide a larger current than the PMOS transistor 121.

When the data signal D is at the low level, the output signal O of the inverter 132 has the low level.

As a result, the switching transistors 123 and 124, which respectively receive the data signal D and the output signal O through gates thereof, are all turned off.

At this time, the switching transistors 115 and 125 are turned on by the write enable signal WE irrespective of the pulse signal OST.

The switching transistors 116 and 126 are turned on while the pulse signal OST is activated.

The switching transistors 116 and 126 are preferably designed to be larger than the switching transistors 115 and 125, so as to allow a larger write current to flow.

Since the data signal D is at the low level, the output signal OB of the inverter 134 has the high level when the pulse signal OST is at the high level.

Accordingly, the switching transistor 114 of the first write circuit 110 is turned on in response to the output signal OB having the high level. That is, the switching transistor 114 is turned on when the inverted data signal DB is at the high level and the pulse signal OST is activated to the high level.

Similarly, in the first write circuit 110, the switching transistor 114 is preferably designed to be larger than the switching transistor 113 so as to allow a larger write current to flow.

The present disclosure has been described above with reference to a write operation for a magnetic memory device in which the write operation is performed using an STT effect.

This operational principle of the present disclosure can be similarly applied to a magnetic memory device that performs a write operation using an SOT effect and to a magnetic memory device that performs a write operation using both the STT effect and the SOT effect.

This technology reduces the overall write time while reducing the power consumption by sequentially applying a pulse-type first write current and a second write current having a lower level than the first write current in a write operation.

In addition, the pulse-type first write current provided by the present technology is applied for a very short time, thereby reducing the possibility of damaging a magnetic element of the magnetic memory device.

Although various embodiments have been described for illustrative purposes, it will be apparent to those skilled in the art that various changes and modifications may be made without departing from the spirit and scope of the invention as defined in the following claims.

What is claimed is:

1. A magnetic memory device, comprising:
    a memory cell including a magnetic tunnel junction (MTJ) element, the MTJ element including a free layer, a barrier layer, and a fixed layer that are stacked in a first direction; and
    a write circuit electrically connected to first and second nodes of the MTJ element and configured to provide a write current to the MTJ element during a write operation,
    wherein the write current includes a first current having a first peak applied for a first time period and a second current having a second peak applied for a second time period, the first peak being greater than two times the second peak and being less than 6 times the second peak, the second time period being longer than the first time period, the first time period being equal to or greater than 400 ps and being equal to or less than 2000 ps,
    wherein the first current and the second current are provided to the MTJ element whenever one bit of data is written into the MTJ element,
    wherein the first current and the second current pass through the MTJ element,
    wherein the second time period is set to reach or exceed a switching point of time at which a spin direction of the free layer of the MTJ element is switched by the write current, and
    wherein the first and second nodes of the MTJ elements are disposed at opposite sides in the first direction, the write current is provided from the first node to the second node when a level of data to be written to the MTJ element is a first level, and the write current is provided from the second node to the first node when a level of data to be written to the MTJ element is a second level different from the first level.

2. The magnetic memory device of claim 1 further comprising:
    a write line connected to the first node of the MTJ element;
    a source line; and
    a switch configured to selectively couple the second node of the MTJ element to the source line,
    wherein the write circuit provides the write current to the MTJ element via the write line and the source line.

3. The magnetic memory device of claim 2, further comprising a spin Hall effect material layer disposed between the MTJ element and the write line in the first direction,
    wherein the write current includes a horizontal current and a vertical current, the horizontal current flowing in the MTJ element in a second direction substantially perpendicular to the first direction, the vertical current flowing through the MTJ element in the first direction.

4. The magnetic memory device of claim 1, further comprising:
a write line;
a source line;
a switch configured to selectively couple the write line and the source line to the MTJ element;
a bit line connected to the second node of the MTJ element; and
a spin Hall effect material layer disposed between the write line and the first node of the MTJ element,
wherein the write circuit provides the write current to the MTJ element via the write line and the source line.

5. The magnetic memory device of claim 1, wherein the first current is a pulse signal provided for the first time period.

6. The magnetic memory device of claim 5, wherein the first current is one of a square wave signal, a triangular wave signal, and an impulse signal.

7. The magnetic memory device of claim 1, wherein the write circuit includes a first write circuit and a second write circuit, one of the first write circuit and the second write circuit sourcing the write current and the other of the first write circuit and the second write circuit sinking the write current.

8. The magnetic memory device of claim 7, wherein the first write circuit includes:
a first transistor configured to turn on during the write operation and to source the second current; and
a second transistor configured to turn on when a pulse signal is enabled during the write operation and to source the first current together with the first transistor that turns on.

9. The magnetic memory device of claim 8, wherein the first write circuit further includes:
a third transistor configured to turn on during the write operation and to sink the second current when the first transistor and the second transistor are turned off; and
a fourth transistor configured to turn on when the pulse signal is enabled during the write operation and to sink the first current together with the third transistor that is turned on.

10. The magnetic memory device of claim 9, wherein the first write circuit further includes:
a fifth transistor configured to turn on during the write operation and to transmit the second current between the first write circuit and the second write circuit; and
a sixth transistor configured to turn on during the write operation and to transmit, together with the fifth transistor that turns on, the first current between the first write circuit and the second write circuit when the pulse signal is enabled during the write operation.

11. An operation method of a magnetic memory device comprising a write circuit configured to provide a write current to a memory cell including a magnetic tunnel junction (MTJ) element that includes a free layer, a barrier layer, and a fixed layer that are stacked in a first direction, the operation method comprising:
providing the MTJ element with a first current having a first peak for a first time period at the beginning of a write operation of the magnetic memory device; and
providing the MTJ element with a second current having a second peak for a second time period during the write operation after providing the first current, the first peak being greater than two times the second peak and being less than 6 times the second peak, the second time period being longer than the first time period, the first time period being equal to or greater than 400 ps and being equal to or less than 2000 ps, the write current including the first current and the second current,
wherein the first current and the second current are provided to the MTJ element whenever one bit of data is written into the MTJ element,
wherein the first current and the second current pass through the MTJ element,
wherein the second time period is set to reach or exceed a switching point of time at which a spin direction of the free layer of the MTJ element is switched by the write current, and
wherein the MTJ element has first and second nodes at opposite sides in the first direction, the write current is provided from the first node to the second node when a level of data to be written to the MTJ element is a first level, and the write current is provided from the second node to the first node when a level of data to be written to the MTJ element is a second level different from the first level.

12. The operation method of claim 11, wherein the first current is a pulse signal provided for the first time period.

13. The operation method of claim 12, wherein the first current is one of a square wave signal, a triangular wave signal, and an impulse signal.

* * * * *